United States Patent
Hayashi et al.

(10) Patent No.: US 9,712,155 B2
(45) Date of Patent: Jul. 18, 2017

(54) DRIVE CIRCUIT FOR POWER SEMICONDUCTOR ELEMENT

(71) Applicant: Mitsubishi Electric Corporation, Tokyo (JP)

(72) Inventors: Yoshitomo Hayashi, Tokyo (JP); Masahiro Ozawa, Tokyo (JP); Toshiki Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 40 days.

(21) Appl. No.: 14/898,488

(22) PCT Filed: Jun. 24, 2013

(86) PCT No.: PCT/JP2013/067287
§ 371 (c)(1),
(2) Date: Dec. 15, 2015

(87) PCT Pub. No.: WO2014/207811
PCT Pub. Date: Dec. 31, 2014

(65) Prior Publication Data
US 2016/0134277 A1 May 12, 2016

(51) Int. Cl.
*H03K 17/30* (2006.01)
*H03K 17/60* (2006.01)
(Continued)

(52) U.S. Cl.
CPC .............. *H03K 17/60* (2013.01); *H02M 1/44* (2013.01); *H03K 17/162* (2013.01);
(Continued)

(58) Field of Classification Search
CPC .... H03K 17/60; H03K 17/162; H03K 17/168; H03K 2217/0036; H02M 1/44; H02M 2001/0054; Y02B 70/1491
(Continued)

(56) References Cited

U.S. PATENT DOCUMENTS 6,271,709 B1    8/2001  Kimura et al.
7,579,880 B2 *  8/2009  Ueda ................ H03K 17/04123
                                                    326/83

(Continued)

FOREIGN PATENT DOCUMENTS

JP    03-093457 A    4/1991
JP    2000-228868 A  8/2000
(Continued)

OTHER PUBLICATIONS

"IGBT application note," Nihon Inter Electronics Corporation, Rev. 1.01, May 2005, pp. 20-22.
(Continued)

*Primary Examiner* — Dinh T Le
(74) *Attorney, Agent, or Firm* — Sughrue Mion, PLLC; Richard C. Turner (57) ABSTRACT

A drive circuit for a power semiconductor element includes: a voltage-command generation unit that generates a voltage command VGEref, which is a charge command between the gate and emitter terminals of a power semiconductor element; and a subtracter that calculates a deviation voltage Verr between the voltage command VGEref and the voltage between the gate and emitter terminals. The drive circuit also includes: a gate current controller that is input with the deviation voltage Verr and calculates a gate-current command voltage VIGref for determining the gate current that is caused to flow to the gate terminal of the power semiconductor element; a gate-current command limiter that limits the gate-current command voltage VIGref; and a gate-current supply device that is input with an actual gate-current command voltage VIGout and that supplies a gate current to the gate terminal of the power semiconductor element.

3 Claims, 10 Drawing Sheets

(51) Int. Cl.
   *H02M 1/44*   (2007.01)
   *H03K 17/16*  (2006.01)
   *H02M 1/00*   (2006.01)
(52) U.S. Cl.
   CPC ... *H03K 17/168* (2013.01); *H02M 2001/0054* (2013.01); *H03K 2217/0036* (2013.01); *Y02B 70/1491* (2013.01)
(58) Field of Classification Search
   USPC .......... 327/37–380; 362/103, 89, 56.05, 98; 323/271, 907
   See application file for complete search history.

(56) References Cited

U.S. PATENT DOCUMENTS

| | | | |
|---|---|---|---|
| 8,138,818 B2 | | 3/2012 | Tsunoda et al. |
| 9,531,377 B2 * | | 12/2016 | Yamamoto .............. F02P 3/055 |

FOREIGN PATENT DOCUMENTS

| | | | |
|---|---|---|---|
| JP | 2009-011049 A | 1/2009 |
| JP | 2009-225506 A | 10/2009 |
| JP | 2013-005474 A | 1/2013 |
| WO | 2009/044602 A1 | 4/2009 |
| WO | 2010/134276 A1 | 11/2010 |

OTHER PUBLICATIONS

International Search Report of PCT/JP2013/067287 dated Jul. 30, 2013.

* cited by examiner

STATIC CHARACTERISTIC

FREQUENCY CHARACTERISTIC

DRIVE CIRCUIT FOR POWER SEMICONDUCTOR ELEMENT

CROSS REFERENCE TO RELATED APPLICATIONS

This is a National Stage of International Application No. PCT/JP2013/067287 filed Jun. 24, 2013, the contents of which are incorporated herein by reference in its entirety.

Field

The present invention relates to a drive circuit for a power semiconductor element.

BACKGROUND

A power semiconductor element such as an IGBT (Insulated Gate Bipolar Transistor) or a MOSFET (insulated gate Field-Effect Transistor) is used as an inverter device that converts a DC current to an AC current and as a power converting apparatus that converts an AC current to a DC current. In such a power semiconductor element, a current flowing from a collector terminal to an emitter terminal in the IGBT or a current flowing from a drain terminal to a source terminal in the MOSFET is controlled by changing the voltage between the gate and emitter terminals (hereinafter, "VGE voltage") or by changing the voltage between the gate and source terminals (hereinafter, "VGS voltage"), with charging or discharging between the gate and emitter terminals (hereinafter, "between G-E") or between the gate and source terminals (hereinafter, "between G-S").

A drive circuit for executing control of the VGE voltage and the VGS voltage in the power semiconductor element described above, which is the drive circuit for the power semiconductor element, generally operates in accordance with a turn-on signal and a turn-off signal, which are pulse signals transmitted from a control circuit. When a turn-on signal is transmitted to the drive circuit, the drive circuit operates such that it electrically charges between G-E of the IGBT or between G-S of the MOSFET, which is a driving object, thereby increasing the VGE voltage or the VGS voltage. Conversely, when a turn-off signal is transmitted to the drive circuit, the drive circuit operates such that it discharges the electric charge between G-E of the IGBT or between G-S of the MOSFET, thereby decreasing the VGE voltage or the VGS voltage.

The drive circuit for the power semiconductor element includes a constant-voltage drive circuit as described in Non Patent Literature 1 listed below. When a turn-on signal is transmitted from a control circuit to a drive circuit, the constant-voltage drive circuit electrically connects between a positive power supply and a gate terminal of an IGBT or a MOSFET via a gate resistance and then charges between G-E or between G-S to increase the VGE voltage or the VGS voltage, thereby turning on the IGBT or the MOSFET. Further, when a turn-off signal is transmitted from the control circuit to the drive circuit, the constant-voltage drive circuit electrically connects between a negative power supply (or ground 0 V) and the gate terminal via a gate resistance and then discharges the electric charge that has built up between G-E or between G-S, S, so as to decrease the VGE voltage or the VGS voltage.

Further, Patent Literature 1 discloses a technique in which a constant-current drive circuit for supplying a constant current to a gate terminal is provided; the VGE voltage between G-E of a power semiconductor element connected to an output terminal of the constant-current drive circuit is compared to a predetermined voltage value. If the VGE voltage increases to more than a set voltage value, the current of the constant-current drive circuit is decreased.

According to the technique disclosed in Patent Literature 1, variations when turning on can be suppressed, and the current can be increased only when it is necessary. Therefore, a low-loss power semiconductor element and power saving of the drive circuit can be realized.

CITATION LIST

Patent Literature

Patent Literature 1: International Publication No. WO2009/044602

Non Patent Literature

Non Patent Literature 1: Nihon Inter Electronics Corporation, IGBT application note, Rev. 1.01 (pages 20 to 22)

SUMMARY

Technical Problem

There are various kinds of VGE voltages, such as a VGE voltage at which a collector current starts to flow when a power semiconductor element turns on (hereafter, "threshold voltage VGEth") and a VGE voltage in a mirror period (hereinafter, "mirror period voltage VGEon"). In the case of the constant-voltage drive circuit described in Non Patent Literature 1, EMI noise (hereinafter, collectively "EMI") such as a switching loss, conduction noise, and radiation noise is determined on the basis of the resistance value of a gate resistance.

For example, if the gate resistance is set to be small, the current flowing to the gate terminal increases. Therefore, the charging time of the VGE voltage decreases and the switching loss decreases. However, because the current change rate di/dt of the collector current of the power semiconductor element increases, the EMI noise increases.

Conversely, if the gate resistance is set to be large, the current flowing to the gate terminal decreases. Therefore, the charging time of the VGE voltage increases and the switching loss increases. However, because the current change rate di/dt of the collector current of the power semiconductor element decreases, the EMI noise can be reduced. That is, when the constant-voltage drive circuit is used, there is a tradeoff between the switching loss and the EMI noise.

According to the technique described in Patent Literature 1, as described above, the current flowing to the gate terminal is constant. Therefore, the charging time of the VGE voltage can be reduced without increasing the current change rate di/dt. Further, when the VGE voltage exceeds a predetermined voltage, control is executed to decrease the current value of the constant-current drive circuit, and thus it is described that power saving of the drive circuit can be realized.

However, generally, the VGE voltage has a value based on the power supply generated by a switching power supply or the like, and if the VGE voltage does not reach a predetermined voltage due to variations in the switching power supply or the like, there is a problem in that the current value of the constant-current drive circuit cannot be decreased.

Furthermore, because there is a sequence based on the comparison result with a predetermined voltage, there is also a problem in that the control becomes complicated.

The present invention has been achieved in view of the above problems, and an objective of the present invention is to provide a drive circuit for a power semiconductor element that can achieve reduction of both switching loss and EMI noise of the power semiconductor element when it turning on.

Solution to Problem

In order to solve the problem and achieve the objective mentioned above, the present invention relates to a drive circuit for a power semiconductor element that includes: a voltage-command generation unit that generates a voltage command, which is a charge command between a gate terminal and an emitter terminal of the power semiconductor element; a deviation calculation unit that calculates a deviation voltage between the voltage command and a voltage between the gate terminal and the emitter terminal of the power semiconductor element; a gate current controller that is input with the deviation voltage, and that calculates a gate-current command voltage for determining a gate current that is caused to flow to the gate terminal of the power semiconductor element; a gate-current command limiter that limits the gate-current command voltage; and a gate-current supply device that is input with an actual gate-current command voltage, which is an output of the gate-current command limiter, and that supplies a gate current to the gate terminal of the power semiconductor element.

Advantageous Effects of Invention

According to the present invention, reduction of both the switching loss and EMI noise of a power semiconductor element when turning it on can be achieved; and power saving of a drive circuit itself can be realized by forming a drive circuit that is robust against variations due to factors such as a power supply and variations due to the power semiconductor element itself.

DESCRIPTION OF EMBODIMENTS

Exemplary embodiments of a drive circuit for a power semiconductor element according to the present invention will be explained below in detail with reference to the accompanying drawings. The present invention is not limited to the embodiments.

Figure 1:
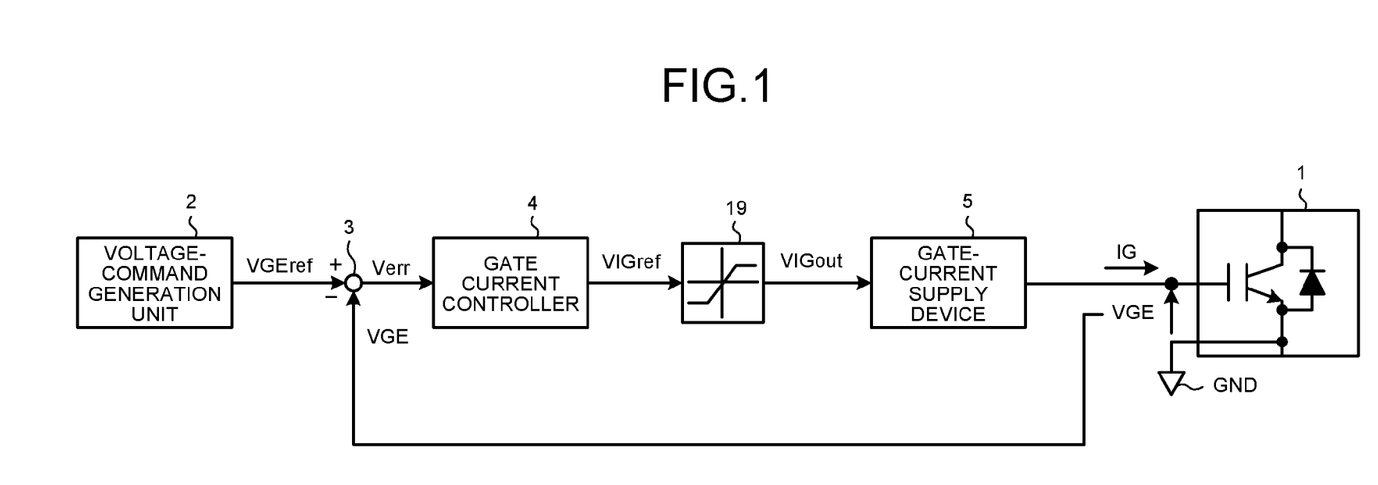
FIG. 1 is a block diagram illustrating an example configuration of a drive circuit for a power semiconductor element according to an embodiment of the present invention.

FIG. 1 is a block diagram illustrating an example configuration of a drive circuit for a power semiconductor element according to an embodiment of the present invention. The drive circuit for the power semiconductor element according to the present embodiment is configured to include, as illustrated in FIG. 1, an IGBl1 configured as a power semiconductor element; a voltage-command generation unit 2 that generates a voltage command VGEref as a command value when charging between a gate terminal and an emitter terminal of the IGBI1; and a subtracter 3 as a deviation-voltage generation unit or a deviation calculation unit that generates and outputs a deviation (hereinafter, "deviation voltage Verr") between the voltage command VGEref and a voltage (hereinafter, "voltage value VGE" or "VGE voltage") between the gate terminal and the emitter terminal of the IGBI1. The drive circuit also includes a gate current controller 4 that is input with the deviation voltage Verr and that calculates a command voltage (hereinafter, "gate-current command voltage VIGref") for determining a gate current that is caused to flow to the gate terminal of the IGBT1; a gate-current command limiter 19 that limits the gate-current command voltage VIGref; and a gate-current supply device 5 that is input with an actual gate-current command voltage VIGout, as an output of the gate-current command limiter 19, and supplies a gate current IG to the gate terminal of the IGBT1.

Figure 2:
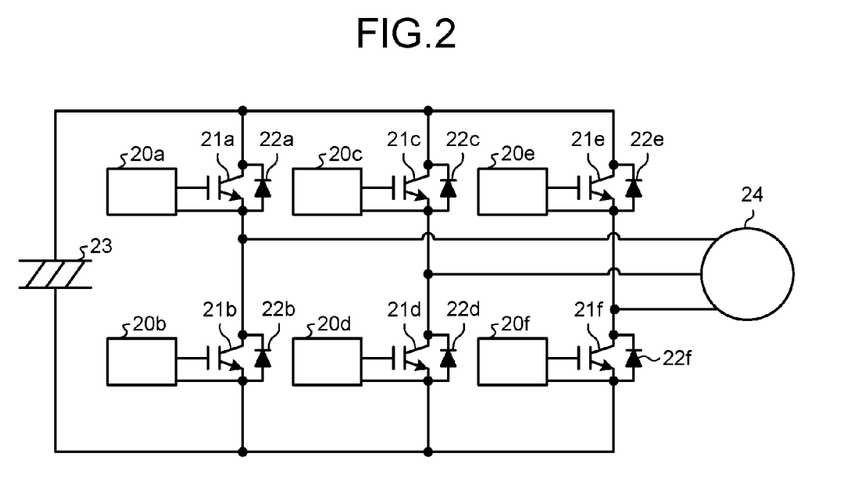
FIG. 2 is a diagram illustrating a configuration of a power converting apparatus for driving a motor as an example of apparatuses controlled by the drive circuit for the power semiconductor element.

The drive circuit for the power semiconductor element according to the present invention can be used for various power converters such as a power converting apparatus for driving a motor, for example, as illustrated in FIG. 2. In the example illustrated in FIG. 2, a three-phase inverter circuit is configured from semiconductor elements for power (IGBT) 21a to 21f in which diodes 22a to 22f are connected, respectively, in inverse-parallel connection. Because the drive circuits 20a to 20f of the power semiconductor element according to the present invention execute switching control of the semiconductor elements for power 21a to 21f, respectively, power accumulated in a smoothing capacitor is supplied to a motor 24, which is an example of a load, and drive control of the motor 24 is executed.

The overall operation of the drive circuit for the power semiconductor element illustrated in FIG. 1 is described here. The voltage command VGEref to be output from the voltage-command generation unit 2 is input to a positive terminal of the subtracter 3. The voltage value VGE is the voltage between the gate and emitter terminals of the IGBT1 and is input to a negative terminal of the subtracter 3. That is, the voltage value VGE is fed back to an input side of the gate current controller 4.

The subtracter 3 uses the voltage command VGEref and the voltage value VGE to generate the deviation voltage Verr, and it outputs the deviation voltage Verr to the gate current controller 4. The gate current controller 4 generates the gate-current command voltage VIGref that decreases the deviation voltage Verr as an output of the subtracter 3, and it outputs the gate-current command voltage VIGref to the gate-current command limiter 19. The gate-current command limiter 19 has a function whereby it limits the gate-current command voltage VIGref. That is, the gate-current command limiter 19 outputs the actual gate-current command voltage VIGout, in which the output of the gate-current command voltage VIGref as the output of the gate current controller 4 is limited, to the gate-current supply device 5. The gate-current supply device 5 generates, on the basis of the actual gate-current command voltage VIGout, the gate current IG to be supplied to the gate terminal of the IGBT1. The gate current IG generated by the gate-current supply device 5 electrically gives charges between the gate and emitter terminals of the IGBT1 so as to increase the voltage value VGE. Due to the above operation, the IGBT1 is turned on.

Figure 3A:
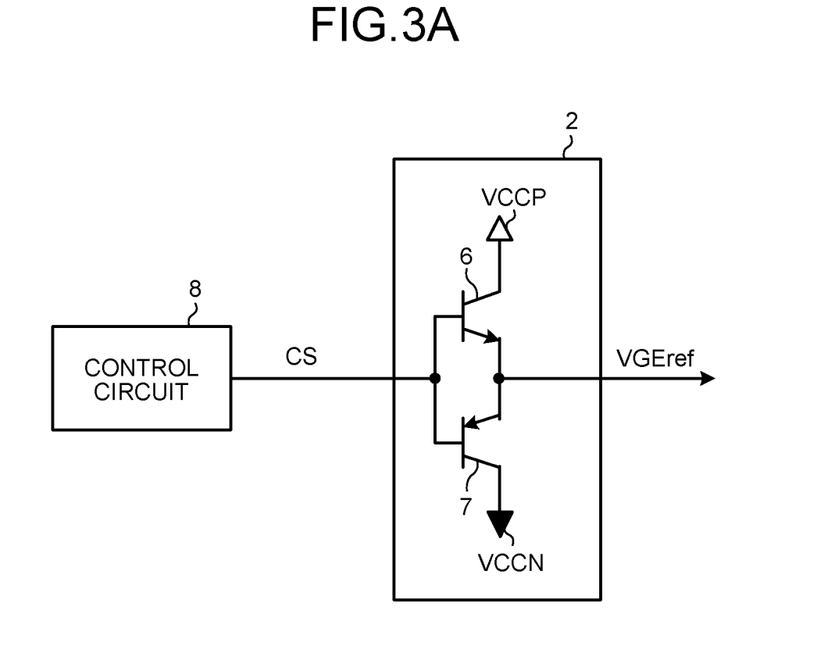
FIG. 3A is a block diagram illustrating an internal configuration example of a voltage-command generation unit.
Figure 3B:
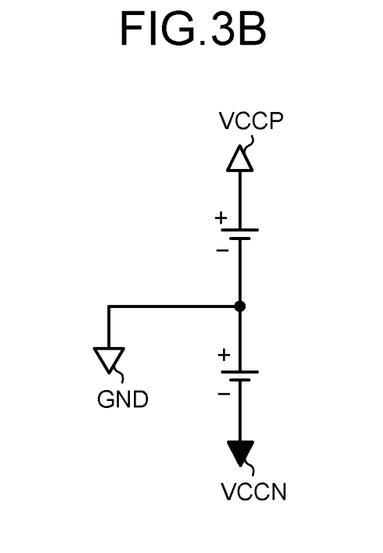
FIG. 3B is a diagram illustrating a connection configuration example between a positive power supply VCCP and a negative power supply VCCN.

The operation of the voltage-command generation unit 2 is described here. FIG. 3A is a block diagram illustrating an example of the internal configuration of the voltage-command generation unit, and FIG. 3B is a diagram illustrating an example of the configuration of connection between a positive power supply VCCP and a negative power supply VCCN.

The voltage-command generation unit 2 performs operations on the basis of a drive signal of a control circuit 8 that outputs an operation signal of the IGBT1. The voltage-command generation unit 2 is configured to include the positive power supply VCCP, the negative power supply VCCN (or ground (GND) 0 V), an NPN transistor 6, and a PNP transistor 7. Each base terminal of the NPN transistor 6 and the PNP transistor 7 are connected to each other, and each emitter terminals of the NPN transistor 6 and the PNP transistor 7 are connected to each other. Further, the positive power supply VCCP and a collector terminal of the NPN transistor 6 are connected to each other, and the negative power supply VCCN and a collector terminal of the PNP transistor 7 are connected to each other. A control signal CS for driving the IGBT1 is output from the control circuit 8 and is input to a connection terminal between the respective base terminals of the NPN transistor 6 and the PNP transistor 7. A voltage value output to the respective emitter terminals of the NPN transistor 6 and the PNP transistor 7 is used as the voltage command VGEref. In FIG. 3B, a case where the negative power supply VCCN has a negative potential is illustrated as an example. However, the negative power supply VCCN can have a ground (GND) potential, i.e., 0 V potential.

When the control signal CS output from the control circuit 8 is a signal for turning on the IGBT1, i.e., a turn-on signal, the NPN transistor 6 is turned on and the PNP transistor 7 is turned off. Accordingly, the voltage (the potential) of the positive power supply VCCP is applied to the emitter terminals of the NPN transistor 6 and the PNP transistor 7, and the voltage becomes the voltage command VGEref. Conversely, when the control signal CS output from the control circuit 8 is a signal for turning off the IGBT1, that is, a turn-off signal is output, the NPN transistor 6 is turned off and the PNP transistor 7 is turned on. Accordingly, a voltage (a potential) of the negative power supply VCCN is applied to the emitter terminals of the NPN transistor 6 and the PNP transistor 7, and the voltage becomes the voltage command VGEref.

The gate current controller 4 is described next. The gate current controller 4 is a section that determines the responsiveness of the drive circuit of the power semiconductor element illustrated in FIG. 1, and it is configured as a proportional controller (P controller). When the gate current controller 4 is configured as the P controller, the transfer function GI(s) of the gate current controller 4 can be expressed with the following equation (1), assuming that the proportional gain is Kp.

$$GI(s)=Kp \qquad (1)$$

The responsiveness of the gate current controller 4 is determined on the basis of the equation (1), and an input signal is calculated on the basis of the proportional gain Kp and is output as the gate-current command voltage VIGref.

The gate-current command limiter 19 is described here. The gate-current command limiter 19 has a function of limiting the gate-current command voltage VIGref. When it is assumed that an output upper limit is VIGrefmis and an output lower limit is VIGrefmin, the actual gate-current command voltage VIGout, which is the output of the gate-current command limiter 19, can be expressed by the following expression (2).

$$VIGrefmin \leq VIGout \leq VIGrefmax \qquad (2)$$

Figure 4:
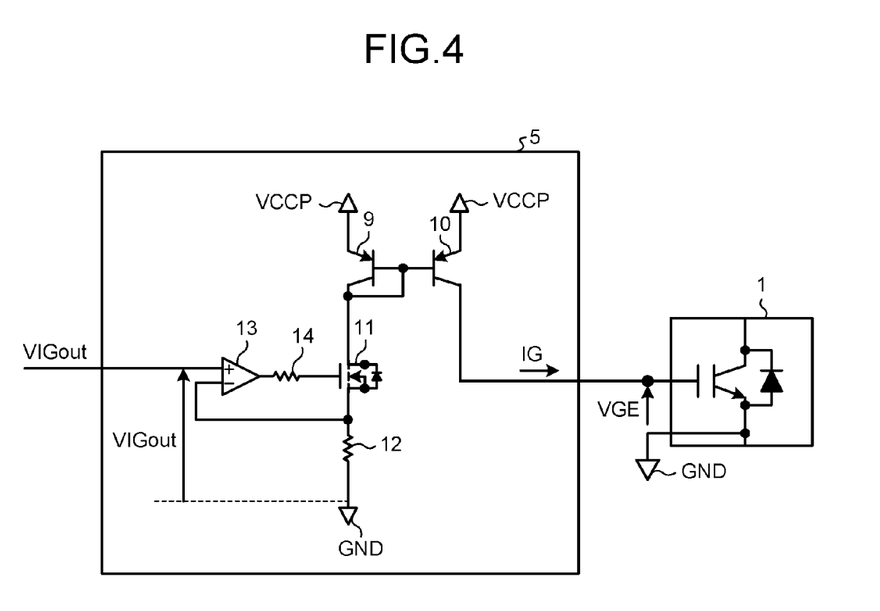
FIG. 4 is a block diagram illustrating an example configuration of a gate-current supply device.

The gate-current supply device 5 is described here. FIG. 4 is a block diagram illustrating an example configuration of the gate-current supply device 5. As illustrated in FIG. 4, the gate-current supply device 5 is configured to include a current mirror circuit including PNP transistors 9 and 10, an N-channel MOSFET 11, resistances 12 and 14, and an operational amplifier 13. The gate-current supply device 5 has a configuration whereby it has a function of supplying, on the basis of the actual gate-current command voltage VIGout, the gate current IG to the gate terminal of the IGBT1.

The actual gate-current command voltage VIGout described above is input to the positive terminal of the operational amplifier 13. The output terminal of the operational amplifier 13 is connected to the gate terminal of the N-channel MOSFET 11 via the resistance 14. A source terminal of the N-channel MOSFET 11 is connected to a GND potential (0 V) via the resistance 12, and the terminal not on the GND potential side of the resistance 12 is connected to the negative terminal of the operational amplifier 13.

The current mirror circuit configured by the PNP transistors 9 and 10 is described here. The emitter terminals of the PNP transistors 9 and 10 are connected to the VCCP, respectively. The base terminal of the PNP transistor 9 is connected to the base terminal of the PNP transistor 10, and it is also connected to the collector terminal of the PNP transistor 9. The collector terminal of the PNP transistor 9 is connected to the drain terminal of the N-channel MOSFET 11, and the collector terminal of the PNP transistor 10 is connected to the gate terminal of the IGBT1.

The gate-current supply device 5 determines the current I1 that flows to the PNP transistor 9 on the basis of the actual gate-current command IGref that is input to the positive terminal of the operational amplifier 13. As described above, the PNP transistors 9 and 10 constitute a current mirror circuit, and a current I1 flowing to the PNP transistor 9 and a current 12 flowing to the PNP transistor 10 have the same value. The collector terminal of the PNP transistor 10 is connected to the gate terminal of the IGBT1, and the gate current IG flowing to the gate terminal becomes the current I2 flowing to the PNP transistor 10.

The actual gate-current command voltage VIGout to be input to the gate-current supply device 5 is the output of the gate current controller 4 and indicates a voltage value. Further, the gate current IG as an output of the gate-current supply device 5 indicates a current value. That is, the gate-current supply device 5 functions as a voltage-current converter, into which a voltage value as the actual gate-current command voltage VIGout is input, and the gate current IG is output therefrom into the gate terminal of the IGBT1.

Figure 5A:
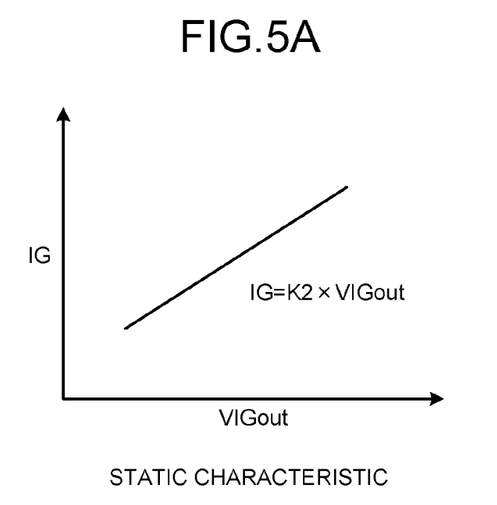
FIG. 5A is a diagram illustrating an example of the input/output characteristics of a gate-current supply device.

FIG. 5A is a diagram (a graph) illustrating an example of the input/output characteristics (static characteristics) of the gate-current supply device 5, in which the gate current IG is plotted on the vertical axis, and the actual gate-current command voltage VIGout is plotted on the horizontal axis. When it is assumed that an input/output conversion gain is K2 (K2 is a positive real number), in the example illustrated in FIG. 5A, the actual gate-current command voltage VIGout and the gate current IG have a relation represented by the following equation (3).

$$IG = K2 \times VIGout \quad (3)$$

Figure 5B:
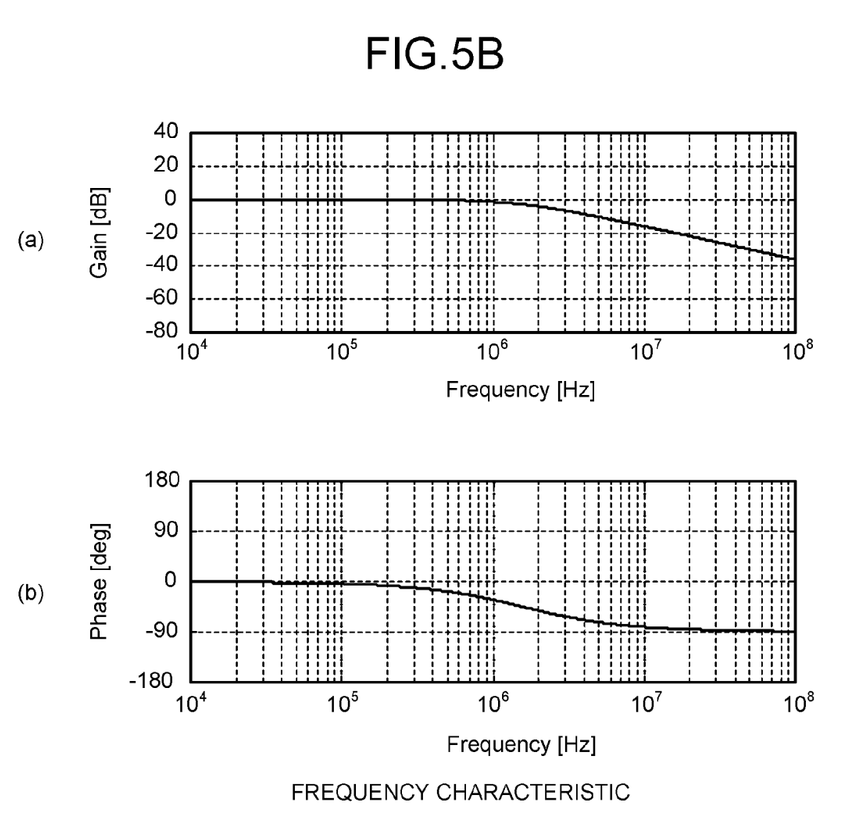
FIG. 5B is a diagram illustrating an example of frequency characteristics (gain and phase) of the gate-current supply device.

FIG. 5B is a diagram (a graph) illustrating an example of the frequency characteristics (gain and phase) of the gate-current supply device 5.

The gate-current supply device 5 that functions as a voltage-current converter is not limited to the configuration and characteristics illustrated in FIG. 5, and it can be realized by other configurations.

Figure 6:
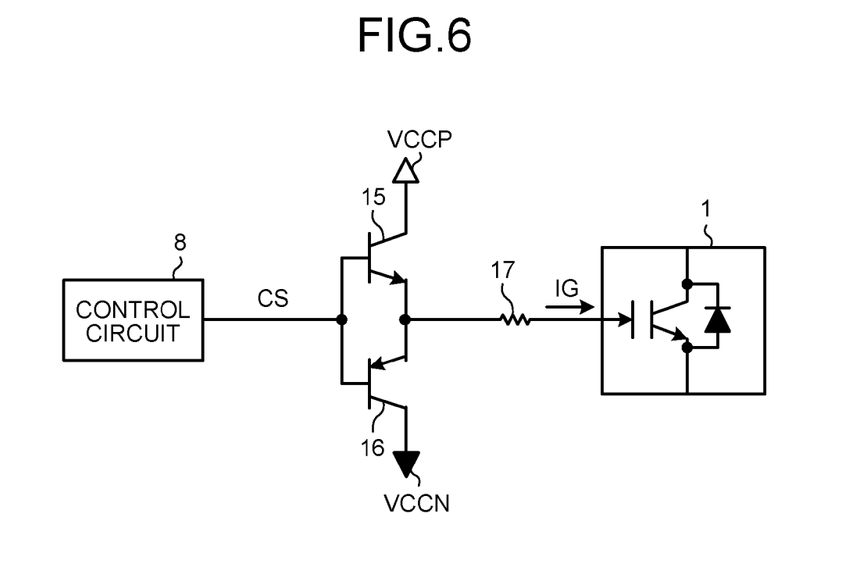
FIG. 6 is a diagram illustrating an example how a constant-voltage drive circuit is configured when an IGBT is used as a power semiconductor element.
Figure 7:
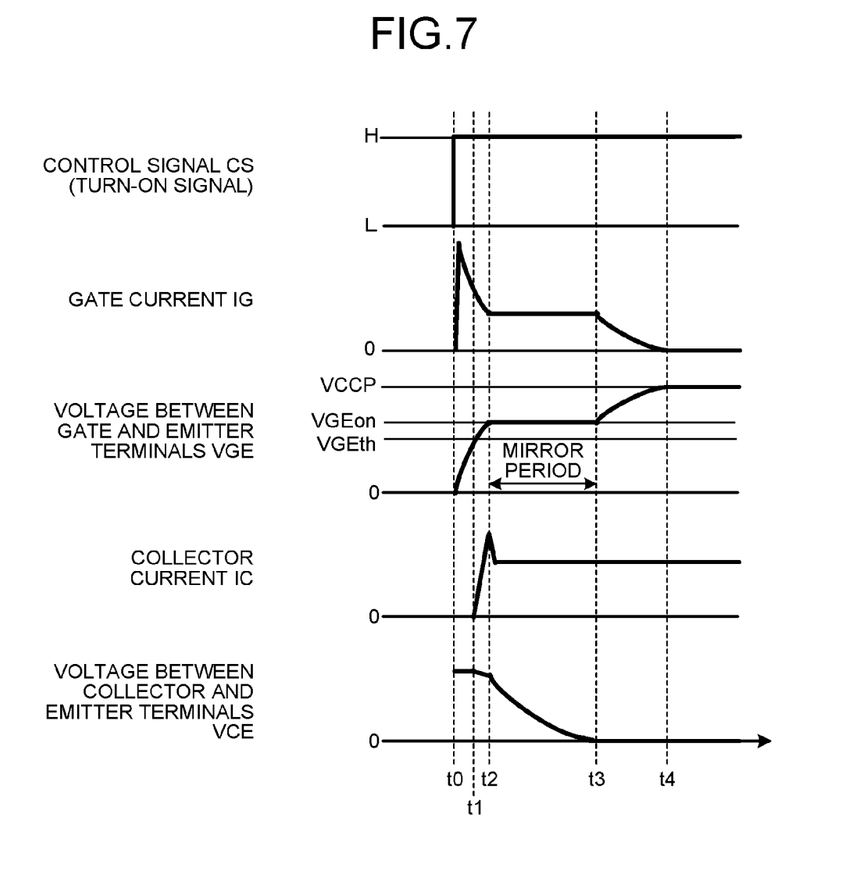
FIG. 7 is a diagram illustrating operating characteristics of the constant-voltage drive circuit illustrated in FIG. 6.

The operating characteristics when turning on a power semiconductor element, such as an IGBT and a MOSFET, are described here. FIG. 6 is a diagram illustrating an example where a constant-voltage drive circuit is configured while an IGBT is used as a power semiconductor element. FIG. 7 is a diagram illustrating operating characteristics of the constant-voltage drive circuit illustrated in FIG. 6, in which timing charts of the voltage VGE between the gate and emitter terminals of the IGBT when turning on, the gate current IG, a collector current IC, and the voltage VCE between collector and emitter terminals are illustrated.

FIG. 6 is described here. The constant-voltage drive circuit illustrated in FIG. 6 is configured to include an NPN transistor 15, a PNP transistor 16, and a gate resistance 17. The respective base terminals of the NPN transistor 15 and the PNP transistor 16 are connected to each other, and a connection terminal thereof is connected to an output of the control circuit 8. The collector terminal of the NPN transistor 15 is connected to the positive power supply VCCP, and the collector terminal of the PNP transistor 16 is connected to the negative power supply VCCN (or ground 0 V). The respective emitter terminals of the NPN transistor 15 and the PNP transistor 16 are connected to each other, and the connection terminal thereof is connected to the gate terminal of the IGBT1 via the gate resistance 17. The control circuit 8 has a function of generating and outputting a drive signal of the IGBT1.

When the turn-on signal is output from the control circuit 8, the NPN transistor 15 is turned on, and the PNP transistor 16 is turned off. Because the NPN transistor 15 is turned on, a current from the positive power supply VCCP flows to the gate terminal of the IGBT1 so as to electrically charge between the gate and emitter terminals thereof. Conversely, when the turn-off signal is output from the control circuit 8, the NPN transistor 15 is turned off, and the PNP transistor is turned on. Because the PNP transistor is turned on, a current flows to the negative power supply VCCN via the gate resistance 17 to discharge the electric charge between the gate and emitter terminals thereof.

FIG. 7 is described here. As described above, when the turn-on signal is output from the control circuit 8, the NPN transistor 15 is turned on, and a current flows to the gate terminal of the IGBT1 via the gate resistance 17.

The section t0 to t1 in the timing chart is described here. A time t0 is a time at which the electrically charging between G-E is started, and a time t1 is a time at which the collector current IC of the IGBT1 starts to flow. The peak value of the gate current has a value obtained by dividing the positive power supply VCCP by the gate resistance 17. If it is assumed that the resistance value of the gate resistance 17 is RG, then the gate-current peak value IGpeak at the turn-on operation start time t0 can be expressed by the following equation (4).

$$IGpeak = VCCP/RG \quad (4)$$

Because an abrupt gate current IG flows, the voltage VGE between the gate and emitter terminals rises. At the time t1, when the voltage VGE between the gate and emitter terminals has reached the threshold voltage VGEth, the collector current IC abruptly starts to flow, and the voltage VCE between the collector and emitter terminals starts to drop.

The section t1 to t2 in the timing chart is described here. A time t2 is a time at which the IGBT1 enters into a period during which a mirror effect is generated (hereinafter, "mirror period"). After the time t1, the gate current IG drops, and the rise of the voltage VGE between the gate and emitter terminals becomes gradual. At the time t2, the mirror period starts.

A section t2 to t3 in the timing chart is described here. A time t3 is a time at which the mirror period of the IGBT1 finishes. During the period from the time t2 to the time t3, the voltage VGE between the gate and emitter terminals becomes constant due to the mirror effect. The mirror period continues until charging of capacitance between the gate and collector terminals finishes, and the gate current IG becomes constant. In the mirror period, while the voltage VCE between the collector and emitter terminals drops, the collector current IC is constant. The gate current IG flowing in the section t2 to t3 can be expressed by the following equation (5).

$$IG = (VCCP - VGEon)/RG \quad (5)$$

A section t3 to t4 in the timing chart is described here. A time t4 is a time at which the voltage VGE between the gate and emitter terminals has been charged up to the positive power supply VCCP. After the time t3 at which the mirror period finishes, the voltage VGE between the gate and emitter terminals starts to rise again, and the gate current IG decreases and the voltage VGE between the gate and emitter terminals reaches the positive power supply VCCP at the time t4.

As described above, when the power semiconductor element is driven by the constant-voltage drive circuit, in order to reduce the switching loss, it is required to finish charging of the voltage VGE between the gate and emitter terminals quickly. In order to finish the charging quickly, it is adequate to decrease a resistance value of the gate resistance and to increase the gate current. However, if the gate current is increased, an abrupt collector current IC flows, and generated noise becomes worse. This is because, if the voltage rises largely when starting to charge the voltage VGE between the gate and emitter terminals, the current change rate of the collector current IC (hereinafter, "di/dt") increases, thereby increasing the generated noise.

Conversely, during the mirror period, as described above, while the voltage VCE between the collector and emitter terminals decreases, the voltage VGE between the gate and emitter terminals is constant, and thus the current change rate di/dt of the collector current IC is small. When the mirror period becomes long, the decrease of the voltage VCE between the collector and emitter terminals is gradual. When the mirror period becomes short, the decrease of the voltage VCE between the collector and emitter terminals is quickened. These tendencies indicate that the switching loss can be decreased by shortening the mirror period.

With the above configuration, in order to decrease the switching loss and generated noise when turning on, a drive circuit for the power semiconductor element having the following control functions becomes necessary.

(1) Decrease the charging rate until the voltage VGE between the gate and emitter terminals reaches the threshold voltage VGEth, i.e., suppress the gate current to be supplied to the gate terminal.

(2) Shorten the mirror period during which the voltage VGE between the gate and emitter terminals becomes constant, i.e., increase the gate current in the mirror period.

The drive circuit for the power semiconductor element according to the present embodiment calculates the gate current IG to be supplied to the gate terminal of the IGBT1. This calculation is done on the basis of the deviation voltage Verr between the VGE voltage and the voltage command VGEref to be applied between G-E.

Figure 8:
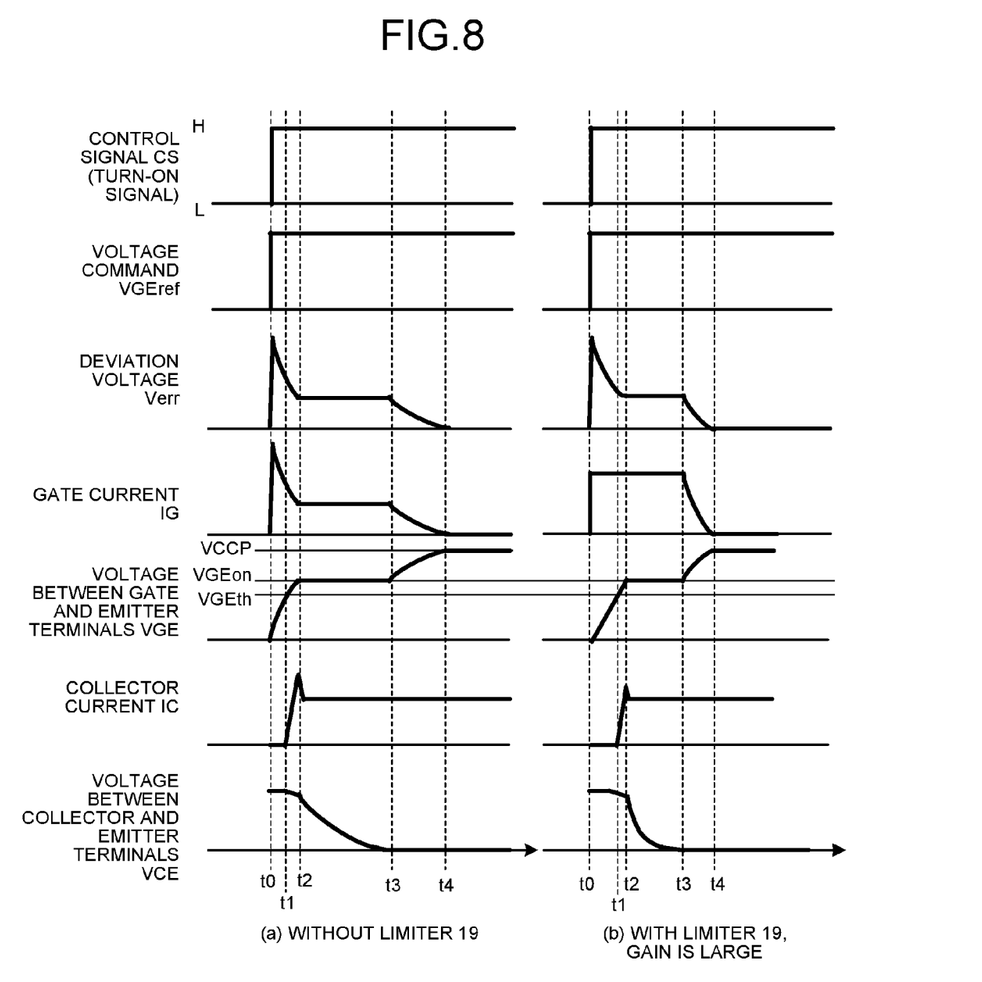
FIG. 8 is timing chart illustrating the operations of the drive circuits according to the embodiment, one of which is provided with and another is not provided with a gate-current command limiter, in a comparison manner.

In FIG. 8(a), the control signal CS, the voltage command VGEref, the deviation voltage Verr, the gate current IG, the VGE voltage, the collector current IC, and the voltage VCE between the collector and emitter terminals are illustrated as their respective waveforms when the gate current controller 4 is a proportional controller and without the gate-current command limiter 19 being provided.

The section t0 to t1 in the timing chart is described here. At the time t0, the control signal CS becomes "H", and the turn-on signal is input to the voltage-command generation unit 2. Accordingly, the voltage command VGEref changes up to the VCCP in a stepwise manner. At this time, because the VGE voltage is 0, the deviation voltage Verr reaches the VCCP. The deviation voltage Verr is input to the gate current controller 4, and the gate current controller 4 calculates the gate-current command voltage VIGref. The gate-current command voltage VIGref at this time can be expressed by the following equation on the basis of the equation (1).

$$VIGref = Kp \times Verr \quad (6)$$

As can be understood from the equation (6), the gate-current command voltage VIGref is obtained by multiplying the deviation voltage Verr by the gain Kp. The gate-current command voltage VIGref is input to the gate-current supply device 5, and the gate-current supply device 5 supplies the gate current IG to the gate terminal of the IGBT1.

In the period until the time t1, as the VGE voltage increases, the deviation voltage Verr decreases, and accompanying thereto, the gate current IG decreases. At the time t1, when the voltage VGE between the gate and emitter terminals has reached the threshold voltage VGEth, the collector current IC abruptly starts to flow, and the voltage VCE between the collector and emitter terminals starts to drop.

The section t1 to t2 in the timing chart is described here. The time t2 is a time at which the IGBT1 enters into the mirror period. After the time t1, the gate current IG drops, and the rise of the voltage VGE between the gate and emitter terminals becomes gradual. At the time t2, the mirror effect starts to appear. Because the rise of the VGE voltage becomes gradual due to the mirror effect, the drop of the deviation voltage Verr also becomes gradual.

The section t2 to t3 in the timing chart is described here. The time t3 is the time at which the mirror period of the IGBT1 finishes. During the period from the time t2 to the time t3, the voltage VGE between the gate and emitter terminals becomes constant due to the mirror effect. Because the VGE voltage is constant, the deviation voltage Verr also becomes constant, and the gate current IG also becomes constant in accordance with the deviation voltage Verr. That is, the gate current IG becomes constant until the mirror period finishes. During the mirror period, the voltage between the collector and emitter terminals drops.

The section t3 to t4 in the timing chart is described here. The time t4 is the time at which the voltage VGE between the gate and emitter terminals has been charged up to the voltage command VGEref, i.e., the VCCP. After the time t3 at which the mirror period finishes, the voltage VGE between the gate and emitter terminals starts to rise again. Therefore, the deviation voltage Verr decreases, and the gate current IG decreases. The voltage VGE between the gate and emitter terminals reaches the VCCP at the time t4.

As is obvious from the comparison between FIG. 7 and FIG. 8(a), the gate current IG, the VGE voltage, the collector current IC, and the voltage VCE between the collector and emitter terminals have similar waveforms.

The gate resistance 17 in the constant-voltage drive circuit illustrated in FIG. 6 corresponds to the proportional gain of the gate current controller 4 illustrated in FIG. 1. Specifically, the decrease in the resistance value of the gate resistance 17 is equivalent to the increase in the proportional gain of the gate current controller 4, and an increase in the resistance value of the gate resistance 17 is equivalent to a decrease in the proportional gain of the gate current controller 4.

That is, the drive circuit for the power semiconductor element according to the present embodiment includes the gate current controller 4 and the gate-current supply device 5 therein, and it controls the gate current IG and the VGE voltage so that the deviation voltage Verr between the voltage command VGEref and the fed-back VGE voltage decreases. At this time, when the proportional gain of the gate current controller 4 is increased, the gate current IG can be increased. Therefore, the charging time of the VGE voltage can be reduced, thereby enabling a decrease in the switching loss when turning on.

Conversely, the increase in the proportional gain of the gate current controller 4 is equivalent to the decrease in the gate resistance, and this worsens EMI noise. Therefore, the drive circuit for the power semiconductor element according to the present embodiment is additionally equipped with the gate-current command limiter 19 (as illustrated in FIG. 1) so as to limit the maximum value of the gate current IG even if the proportional gain of the gate current controller 4 is increased.

FIG. 8(b) is a diagram illustrating waveforms when the gate-current command limiter 19 is added and the proportional gain of the gate current controller 4 is increased. Similar to FIG. 8(a), the control signal CS, the voltage command VGEref, the deviation voltage Verr, the gate current control IG, the VGE voltage, the collector current IC, and the voltage VCE between the collector and emitter terminals are illustrated.

The section t0 to t1 in the timing chart is described here. At the time t0, the control signal CS becomes "H", and the turn-on signal is input to the voltage-command generation unit 2. Accordingly, the voltage command VGEref charges up to the VCCP in a stepwise manner. At this time, because the VGE voltage is 0, the deviation voltage Verr reaches the VCCP. The deviation voltage Verr is input to the gate current controller 4, and the gate current controller 4 calculates the gate-current command voltage VIGref. Further, the gate-current command voltage VIGref is limited to the actual gate-current command voltage VIGout by the gate-current command limiter 19, and the gate current IG is supplied from the gate-current supply device 5. In the period from the time t0 to the time t1, the gate current IG is limited by the gate-current command limiter 19. Because the gate current IG is limited to be fixed, the VGE voltage is not charged abruptly, but is charged with a certain inclination, or a change ratio.

The section t1 to t2 in the timing chart is described here. At the time t1, the VGE voltage reaches the threshold voltage VGEth, the collector current IC of the IGBT1 starts to flow, and the voltage VCE between the collector and emitter terminals of the IGBT1 starts to drop. Also during the period, the gate current IG is limited to being constant, and the VGE voltage is charged with a certain inclination, similar to the period from the time t0 to the time t1. At the time t2, the VGE voltage reaches VGEon, and the mirror period starts.

The section t2 to t3 in the timing chart is described here. At the time t2, because the mirror period starts, the VGE voltage is constant. Even in the mirror period, the gate current IG is limited to being constant by the gate-current command limiter 19. At this time, the voltage VCE between the collector and emitter terminals of the IGBT1 gradually decreases. At the time t3, the mirror period finishes.

The section t3 to t4 in the timing chart is described here. The rise of the VGE voltage is resumed from the time t3. Accompanying this rise, the deviation voltage Verr is decreased, and the gate current IG generated in accordance with the deviation voltage Verr is also decreased. At the time t4, the VGE voltage reaches the VCCP, which is the output value of the voltage command VGEref, and the deviation voltage Verr and the gate current IG become 0.

By comparing FIG. 8(a) and FIG. 8(b), in the period from the time t0 to the time t1, i.e., in the period after the turn-on signal is input until the VGE voltage reaches VGEth, which is the VGE voltage at which the collector current IC of the IGBT1 starts to flow, it can be seen that the time until reaching the threshold voltage VGEth is quicker in FIG. 8(a), in which the gate-current command limiter 19 is not added. Also in the period from the time t1 to the time t2, i.e., in the period during which the VGE voltage rises from VGEth and reaches VGEon and the mirror period starts, the time until reaching VGEon is quicker in FIG. 8(a) in which the gate-current command limiter 19 is not added. Due to these tendencies, when the gate-current command limiter 19 is not added, the current change rate di/dt of the collector current IC increases when compared to a case where the gate-current command limiter 19 is added, and the EMI noise increases.

Conversely, in the case of FIG. 8(b), in which the gate-current command limiter 19 is added, because the maximum value of the gate current IG is limited, the charging time of the VGE voltage becomes gradual, and when compared to FIG. 8(a), the current change rate di/dt of the collector current IC can be decreased, thereby enabling a reduction in the EMI noise.

Furthermore, in the period from the time t2 to the time t3, i.e., in the mirror period, the mirror period can be shortened in FIG. 8(b), in which the gate-current command limiter 19 is added. This is because, by increasing the proportional gain of the gate current controller 4, the gate current IG can be set to flow much more than the case in FIG. 8(a).

Further, in the period from the time t3 to the time t4, i.e., in the period until the VGE voltage has reached VCCP, which is the voltage command VGEref, both in FIG. 8(a) and FIG. 8(b), the gate current IG on the basis of the deviation voltage Verr is made to flow. However, in FIG. 8(b), because the proportional gain of the gate current controller 4 is set to be large, the period during which the deviation voltage Verr is generated can be made shorter than that in FIG. 8(a).

As described above, in the drive circuit for the power semiconductor element according to the present embodiment, when the gate-current command limiter 19 is added and the proportional gain of the gate current controller 4 is set to be large, the following effects can be obtained.

In the period since input of a turn-on signal until the VGE voltage reaches VGEth, i.e., in a period until the IGBT1 enters into a mirror period, the current change rate di/dt of the collector current IC can be suppressed, thereby enabling the prevention of the EMI noise from being worsened.

A charging period of the VGE voltage after a mirror period can be shortened. Therefore, the voltage VCE between the collector and emitter terminals of the IGBT1 can be quickly decreased, thereby enabling a decrease in Pm=ICxVCE, which corresponds to the switching loss.

Because the gate current IG is generated on the basis of the deviation voltage Verr and the gate-current command limiter 19, the gate voltage is limited on the basis of a maximum output value of the gate-current command limiter 19 in the period when the deviation voltage Verr is large; and when the deviation voltage Verr decreases to be lower than the maximum output value of the gate-current command limiter 19, the gate current IG is supplied on the basis of the deviation voltage Verr. Accordingly, the gate current IG is supplied only when it is required, and thus power saving of the drive circuit itself can be realized.

As described above, FIG. 8(a) illustrates an operation equivalent to that of the constant-voltage drive circuit (see FIG. 7). Therefore, it can be said that the drive circuit for the power semiconductor element according to the present embodiment performs better operations than those of the constant-voltage drive circuit disclosed in Non Patent Literature 1.

Furthermore, the drive circuit for the power semiconductor element illustrated in FIG. 1 can realize a reduction of both the EMI noise and the switching loss when turning on, by setting the gate-current command limiter 19 and the gate current controller 4 as described below.

The maximum output value of the gate-current command limiter 19, i.e., the gate current IG to be supplied to the gate terminal of the IGBT1 is set to such a level that the current change rate di/dt of the collector current IC does not worsen the EMI noise. Alternatively, the gate current IG is limited by the gate-current command limiter 19, and is set to a level at which the EMI noise is suppressed.

The proportional gain is set so that the gate-current command value, which is the output of the gate current controller 4, exceeds the limit value set by the gate-current command limiter 19.

By setting the gate-current command limiter 19 and the gate current controller 4 as described above, the constant gate current IG is supplied in a period since the input of the turn-on command until the end of the mirror period, and after the mirror period has finished, the gate current IG in accordance with the deviation voltage Verr is supplied. Accordingly, reduction of both the EMI noise and the switching loss when turning on can be realized, and thus power saving of the drive circuit itself can be realized.

Further, the drive circuit for the power semiconductor element according to the present embodiment makes up a feed-back control system that feeds back the VGE voltage and calculates the deviation voltage Verr between the voltage command voltage command VGEref and the VGE voltage, thereby controlling the gate current IG so as to decrease the deviation voltage Verr. Accordingly, a drive circuit that is robust against various variations can be obtained. These variations are additionally described below.

As one factor related to these variations, an external factor is described first. Generally, the drive circuit for the power semiconductor element is operated by using a power-supply voltage supplied from an external power supply circuit as a power source. It is assumed that the positive power supply VCCP illustrated in FIG. 2 supplied from the external power supply circuit is larger than a predetermined voltage by ΔV1 due to the variations in the power supply circuit. In this case, in the constant-voltage drive circuit, a peak current IGpeak of the gate current IG can be expressed by the following equation, on the basis of the equation (4) when starting the turn-on operation.

$$IGpeak=(VCCP+\Delta V1)/RG \quad (7)$$

When the equation (7) is established, the time until the VGE voltage reaches the threshold voltage VGEth and the mirror period voltage VGEon becomes short. Therefore, the current change rate di/dt of the collector current IC becomes larger than supposition, thereby worsening the EMI noise.

Conversely, in the case of the drive circuit for the power semiconductor element according to the present embodiment, because the gate current IG is limited by the gate-current command limiter 19, the time until the VGE voltage reaches the threshold voltage VGEth and the mirror period voltage VGEon can be made constant. Therefore, the current change rate di/dt of the collector current IC does not increase, and worsening of the EMI noise can be prevented.

Furthermore, as another factor related to these variations, variations of the power semiconductor element itself such as the IGBT1 are described. In a power semiconductor element such as an IGBT and a MOSFET, the threshold voltage VGEth and the mirror period voltage VGEon vary due to the variations in the ambient temperature and the element itself. For example, if the mirror period voltage VGEon increases by ΔV2, in the constant-voltage drive circuit, the gate current IG flowing in the mirror period is expressed by the following equation, on the basis of the equation (5).

$$IG=(VCCP-(VGEon+\Delta V2))/RG \quad (8)$$

Variations are generated in the gate current IG flowing in the mirror period on the basis of the equation (8), due to the variations in the mirror period voltage VGEon. Due to the variations in the gate current IG, variations are generated in the mirror period. As can be understood from FIG. 7 and FIG. 8(a), during the mirror period, the voltage VCE between the collector and emitter terminals of the IGBT1 is decreased. When variations are generated in the mirror period, the time until the voltage VCE between the collector and emitter terminals is decreased varies, and thus the loss Pm=IC×VCE in the mirror period also varies.

Further, in the case of the drive circuit for the power semiconductor element according to the present embodiment, as described above, because the constant gate current IG can be supplied until the end of the mirror period, the variations in the mirror period can be suppressed. As a result, the variations in the loss Pm during the mirror period can be suppressed.

Figure 9:
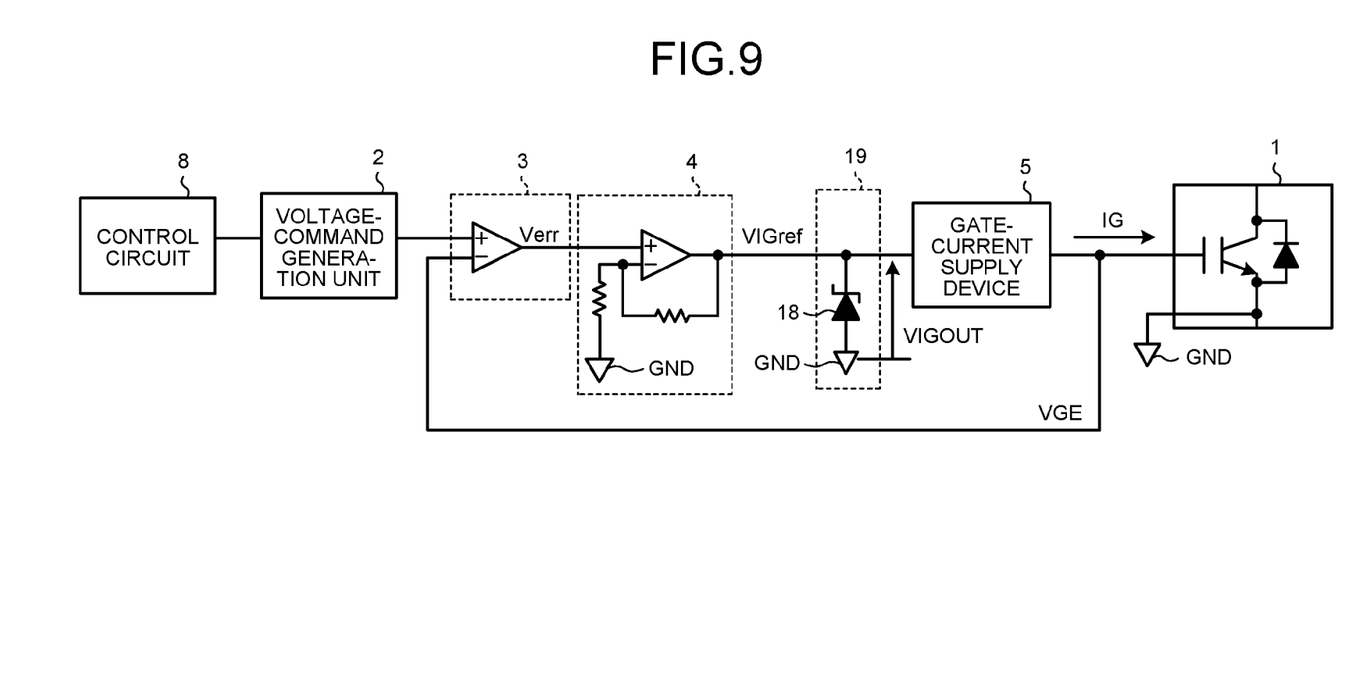
FIG. 9 is a diagram illustrating a more detailed configuration example of the drive circuit for the power semiconductor element according to the embodiment.

FIG. 9 is a diagram illustrating a more detailed example configuration of the drive circuit for the power semiconductor element according to the present embodiment.

As can be understood from the comparison with FIG. 1, a non-inverting amplifier, for example, can be used as the gate current controller 4, and the gate-current command limiter 19 can be realized, for example, by connecting the cathode of a zener diode 18 to an output line and the anode of the zener diode 18 to the ground potential.

Figure 10:
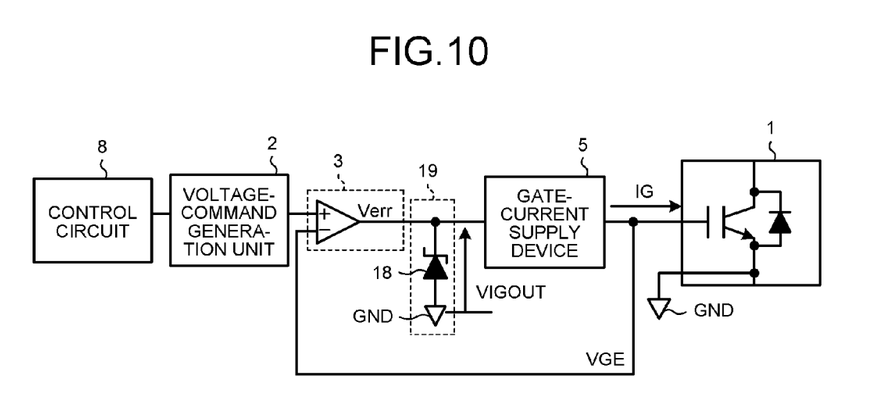
FIG. 10 is a diagram illustrating a modification of the drive circuit for the power semiconductor element according to the embodiment.

FIG. 10 is a diagram illustrating a modification of the drive circuit for the power semiconductor element according to the present embodiment. As illustrated in FIG. 10, the gate current controller 4 can be omitted. In this case, the subtracter 3 as a deviation-voltage generation unit calculates the deviation voltage Verr between the voltage command VGEref and the VGE voltage, amplifies the deviation voltage Verr, and outputs the amplified deviation voltage Verr. The gate-current command limiter 19 recognizes the deviation voltage Verr, which is an output from the subtracter 3 as the deviation-voltage generation unit, as the gate-current command voltage VIGref for determining the gate current to be caused to flow to the gate terminal of the power semiconductor element, thereby generating the actual gate-current command voltage VIGout by limiting the value of the gate-current command voltage VIGref.

The material of the power semiconductor element is described next. As the power semiconductor element, silicon (Si) is generally used as a material therefor. Meanwhile, the technique according to the present embodiment is not limited to a power semiconductor element formed by using silicon as its material. Needless to mention, the technique can be applied to a power semiconductor element formed by using silicon carbide (SiC), which has been drawing attention in recent years as the material to use instead of silicon.

The switching element using silicon carbide (SiC) has a feature of being capable of realizing higher speed switching, as compared to an IGBT using silicon (Si). Therefore, the carrier frequency can be increased. However, if the switching speed is increased as described above, there is a problem in that there is an increase in the EMI noise due to an increase of the carrier frequency, in addition to a problem that the EMI noise is worsened. Therefore, it is difficult to simply execute control to increase the carrier frequency without handling the problem of the increase in the EMI noise.

As described above, according to the technique of the present embodiment, the current change rate di/dt of the collector current IC can be suppressed, and thus worsening of the EMI noise that can occur a problem when the carrier frequency increases, can be suppressed.

Silicon carbide (SiC) is an example of a semiconductor referred to as "wide-bandgap semiconductor". It is called a wide-bandgap semiconductor because of its characteristic that the bandgap is larger than that of silicon (Si). Other than silicon carbide, semiconductors formed by using, for example, gallium nitride material or diamond also are types of wide-bandgap semiconductors, and the characteristics thereof have many similarities to those of silicon carbide.

Therefore, configurations using wide-bandgap semiconductors other than silicon carbide are also within the scope of the present invention.

Furthermore, a power semiconductor element formed by such a wide-bandgap semiconductor has a high voltage resistance and a high allowable current density, thereby enabling downsizing of the power semiconductor element. By using such a downsized power semiconductor element, downsizing of a semiconductor module incorporating the power semiconductor element becomes possible.

Further, the power semiconductor element formed by the wide-bandgap semiconductor has a high heat resistance, and thus downsizing of a heat radiator and a cooler can be realized.

The configuration described in the above embodiment is only an example of the details of the present invention. The configuration can be combined with other well-known techniques, and it is needless to mention that the present invention can be configured while modifying it without departing from the scope of the invention, such as omitting a part of the configuration.

INDUSTRIAL APPLICABILITY

As described above, the present invention is useful as a drive circuit for a power semiconductor element that can achieve a reduction of both switching loss and EMI noise in the power semiconductor element when turning on.

REFERENCE SIGNS LIST

1 power semiconductor element, 2 voltage-command generation unit, 3 subtracter, 4 gate current controller, 5 gate-current supply device, 6, 15 NPN transistor, 7, 9, 10, 16 PNP transistor, 8 control circuit, 11 N-channel MOSFET, 12, 14 resistance, 13 operational amplifier, 17 gate resistance, 18 zener diode, 19 gate-current command limiter, CS control signal, IG gate current, VGEref voltage command, Verr deviation voltage, VIGref gate-current command voltage, VIGout actual gate-current command voltage.

The invention claimed is:

1. A drive circuit for a power semiconductor element comprising:
   a voltage-command generation unit that generates a voltage command, which is a charge command between a gate terminal and an emitter terminal of the power semiconductor element;
   a deviation calculation unit that calculates a deviation voltage between the voltage command and a voltage between the gate terminal and the emitter terminal of the power semiconductor element;
   a gate current controller that is input with the deviation voltage, and that calculates a gate-current command voltage for determining a gate current that is caused to flow to the gate terminal of the power semiconductor element;
   a gate-current command limiter that limits the gate-current command voltage; and
   a gate-current supply device that is input with an actual gate-current command voltage, which is an output of the gate-current command limiter, and that supplies a gate current to the gate terminal of the power semiconductor element.

2. The drive circuit for a power semiconductor element according to claim 1, wherein
   the gate current controller is constituted by a proportional controller.

3. A drive circuit for a power semiconductor element comprising:
   a voltage-command generation unit that generates a voltage command, which is a command value when charging between a gate terminal and an emitter terminal of a power semiconductor element;
   a deviation-voltage generation unit that calculates a deviation voltage between the voltage command and a voltage between the gate terminal and the emitter terminal of the power semiconductor element, amplifies the deviation voltage, and outputs an amplified deviation voltage;
   a gate-current command limiter that recognizes the deviation voltage from the deviation-voltage generation unit as a gate-current command voltage for determining a gate current to be caused to flow to the gate terminal of the power semiconductor element and that generates an actual gate-current command voltage by limiting a value of the gate-current command voltage; and
   a gate-current supply device that is input with the actual gate-current command voltage and that supplies a gate current to the gate terminal of the power semiconductor element.

* * * * *